(12) United States Patent
Kang et al.

(10) Patent No.: US 9,461,270 B2
(45) Date of Patent: Oct. 4, 2016

(54) METHOD FOR MANUFACTURING ORGANIC LIGHT EMITTING DIODE DISPLAY DEVICE

(71) Applicant: LG DISPLAY CO., LTD., Seoul (KR)

(72) Inventors: Jin Goo Kang, Seoul (KR); Young Hoon Shin, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/529,020

(22) Filed: Oct. 30, 2014

(65) Prior Publication Data
US 2015/0147833 A1 May 28, 2015

(30) Foreign Application Priority Data

Nov. 25, 2013 (KR) .................. 10-2013-0143523

(51) Int. Cl.
*H01L 51/52* (2006.01)
*H01L 27/12* (2006.01)

(52) U.S. Cl.
CPC ....... *H01L 51/5253* (2013.01); *H01L 27/1225* (2013.01)

(58) Field of Classification Search
CPC .................................................. H01L 51/5237
See application file for complete search history.

(56) References Cited

U.S. PATENT DOCUMENTS 4,692,205 A * 9/1987 Sachdev et al. ............. 174/256
5,895,228 A 4/1999 Biebuyck et al.
7,776,670 B2 8/2010 Yamashita et al.
2002/0153523 A1* 10/2002 Bernius et al. ................. 257/40
2006/0228827 A1* 10/2006 Kim .................. C23C 16/45565
                                                       438/82
2012/0280216 A1* 11/2012 Sirringhaus et al. ........... 257/40
2013/0026505 A1 1/2013 Lee et al.
2013/0099228 A1 4/2013 Ahn et al.
2014/0285914 A1* 9/2014 Sakano et al. ................ 359/892

FOREIGN PATENT DOCUMENTS

| EP | 2 136 423 A1 | 12/2009 |
| JP | 2004-35941 A | 2/2004 |
| JP | 2010-141142 A | 6/2010 |
| WO | WO 2007/145075 A1 | 12/2007 |
| WO | WO 2013/134661 A1 | 9/2013 |

* cited by examiner

*Primary Examiner* — Yu-Hsi D Sun
(74) *Attorney, Agent, or Firm* — Birch, Stewart, Kolasch & Birch, LLP

(57) ABSTRACT

A method of manufacturing an OLED device is discussed. The method can include forming a gate electrode on a substrate; forming a gate insulation film on the substrate provided with the gate electrode; forming a channel layer, a source electrode and a drain electrode on the substrate provided with the gate insulation film; forming an organic light emitting diode which includes a first electrode connected to the drain electrode, an organic emission layer formed on the first electrode, and a second electrode formed on the organic emission layer; forming a passivation layer, which has a hydrogen content below 10%, on the substrate provided with the organic light emitting diode using an organic silicon compound; and forming a sealing layer on the substrate provided with the passivation layer.

11 Claims, 5 Drawing Sheets

| Item | Layer | H Conc(%) |
|---|---|---|
| HMDSN CVD(FIRST EMBODIMENT) | SiONx, SiNx, SiOx | <10.0 |
| HMDSN CVD(SECOND EMBODIMENT) | SiOx | <10.0 |

| Item | Layer | H Conc(%) |
|---|---|---|
| PECVD(RELATED ART) | SiONx | 13.7 |

METHOD FOR MANUFACTURING ORGANIC LIGHT EMITTING DIODE DISPLAY DEVICE

The present application claims priority under 35 U.S.C. §119(a) of Korean Patent Application No. 10-2013-0143523 filed on Nov. 25, 2013, which is hereby incorporated by reference in its entirety.

BACKGROUND OF THE INVENTION

1. Field of the Disclosure

The present application relates to an organic light emitting diode (OLED) display device. More particularly, the present application relates to a manufacturing method of an organic light emitting display device adapted to enhance the performance of an oxide thin film transistor by reducing a hydrogen content within a passivation layer.

2. Description of the Related Art

Image display devices realizing a variety of information on screens correspond to a core technology of the information communication age. As such, the image display devices are being developed in such a manner as to be more thin and light and portable and have high performance. Moreover, flexible display devices are being required in order to enhance convenience of users and spatiality. In view of these points, OLED display devices controlling alight emitting quantity of an organic emission layer come into the spotlight as flat panel display devices.

The OLED display device includes: a thin film transistor array formed on a substrate; organic light emitting cells disposed over the thin film transistor array; and a glass cap used to isolate from the exterior. Such an OLED display device uses an electroluminescent phenomenon. In other words, The OLED display device emits light by enabling excitons within an organic emission layer to transition from an excitation state to a ground (a base) state. The excitons are formed through recombination of electrons and holes which are injected from an electron injection electrode and a hole injection electrodes into the organic emission layer when an electric field is applied between anode and cathode electrodes on both sides of the organic emission layer.

In detail, the OLED display device includes a plurality of sub-pixels arranged pixel regions which are defined by gate lines and data lines crossing each other. Each of the sub-pixels receives a data signal from the respective data line when a gate pulse is applied from the respective gate line. Also, each of the sub-pixels emits light corresponding to the received data signal. Such a sub-pixel includes: a thin film transistor formed on the substrate; and an organic light emitting cell connected to the thin film transistor.

FIG. 1 is a cross-sectional view showing a pixel region of a general OLED display device.

Referring to FIG. 1, the OLED display device 100 includes: an array layer 103 formed on a substrate 101; an organic light emitting diode (OLED) layer 105 formed on the array layer 103; a passivation layer 106 configured to encompass the OLED layer 105; and an adhesive layer 107 and a sealing layer 110 formed on the passivation layer 106. The array layer 103 includes thin film transistors, gate lines, data lines and power lines which are formed on the substrate 101. The OLED layer 105 includes electrodes and organic emission layer.

The passivation layer 106 is formed by depositing a SiN-based or SiO-based compound on the substrate 101 (i.e., on the OLED layer 105) using a PECVD (plasma enhanced chemical vapor deposition) method.

However, in order to prevent deterioration of the organic emission layer within the OLED layer 105, the formation process of the passivation layer 106 must be performed under a low temperature status below 100° C. Due to this, a large quantity of hydrogen included into $SiH_4$-based and $NH_3$-based gases must remain in the passivation layer 106.

The hydrogen remaining in the passivation layer 106 is drifted toward the array layer 103 under the passivation layer 106 as time passes. Also, the drifted hydrogen H deoxidizes an oxide semiconductor layer (a channel layer) of the thin film transistor within the array layer 103. As such, the performance of the thin film transistor must deteriorate.

In other words, the residual hydrogen H in the passivation layer 106 shifts a threshold voltage Vth of the thin film transistor. As such, faults such as a screen stain and non-uniformity of brightness are generated.

BRIEF SUMMARY OF THE INVENTION

Accordingly, embodiments of the present application are directed to a manufacturing method of an OLED display device that substantially obviates one or more of problems due to the limitations and disadvantages of the related art.

The embodiments are to provide a manufacturing method of an OLED display device which is adapted to prevent deterioration of performance of an element by allowing a passivation layer of a low hydrogen content to cover an OLED with an organic emission layer.

Also, the embodiments are to provide a manufacturing method of an OLED display device which is adapted to minimize a hydrogen content of a passivation layer covering an OLED with an organic emission layer by forming the passivation layer through polymerization of an organic silicon compound and one of oxygen and nitrogen monoxide.

Additional features and advantages of the embodiments will be set forth in the description which follows, and in part will be apparent from the description, or may be learned by practice of the embodiments. The advantages of the embodiments will be realized and attained by the structure particularly pointed out in the written description and claims hereof as well as the appended drawings.

According to a general aspect of the present embodiment, a manufacturing method of an OLED display device includes : forming a gate electrode on a substrate; forming a gate insulation film on the substrate provided with the gate electrode; forming a channel layer, a source electrode and a drain electrode on the substrate provided with the gate insulation film; forming an organic light emitting diode which includes a first electrode connected to the drain electrode, an organic emission layer formed on the first electrode, and a second electrode formed on the organic emission layer; forming a passivation layer , which has a hydrogen content below 10%, on the substrate provided with the organic light emitting diode using an organic silicon compound; and forming a sealing layer on the substrate provided with the passivation layer.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated herein and constitute a part of this application, illustrate embodiment(s) of the present disclosure and together with the description serve to explain the disclosure. In the drawings.

DETAILED DESCRIPTION OF THE EMBODIMENTS

Figure 1:
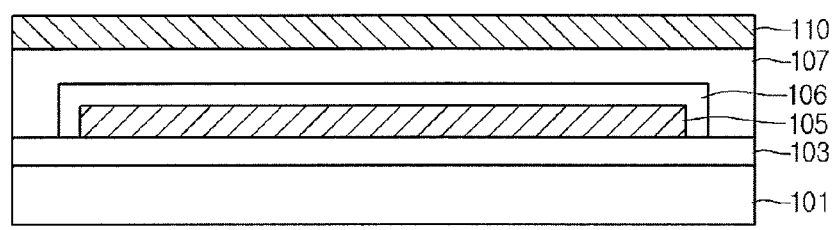
FIG. 1 is a cross-sectional view showing a pixel region of a general OLED display device.

Reference will now be made in detail to the embodiments of the present invention, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

FIGS. 2A through 2D are cross-sectional views illustrating a method of manufacturing an OLED display device according to an embodiment of the present disclosure. FIGS. 3A and 3B are diagrams showing structural formulas of organic silicon compounds which are used to form a passivation layer of the OLED display device according to an embodiment of the present disclosure.

Referring to FIGS. 2A through 3B, a manufacturing method of the OLED display device forms a gate electrode 201 in a pixel region by depositing a gate metal film on the entire surface of a substrate 200 and performing a first mask procedure for the gate metal film. At the same time, a signal line 212 can be formed with the gate electrode. The signal line 212 can be a power line or an electrode of a different thin film transistor.

Although it is not shown in the drawings, the gate electrode 201 is connected to a gate line. The gate line can be used to transfer a driving signal.

The gate metal film can be formed in a single layer and from an opaque conductive material with a low resistance. As an example of the opaque conductive material with the low resistance can be one of aluminum Al, an aluminum alloy, tungsten W, copper Cu, nickel Ni, chromium Cr, molybdenum Mo, titanium Ti, platinum Pt, tantalum Ta and so on. Alternatively, the gate metal film can be formed in a multi-layered structure with at least one transparent conductive material layer and at least one opaque conductive material layer. The transparent conductive material can be one of indium-tin-oxide (ITO), indium-zinc-oxide (IZO) and so one.

After the gate electrode 201 is formed on the substrate 200 as described above, a gate insulation film 202 is formed on the entire surface of the substrate provided with the gate electrode 201. The gate insulation film 202 can be formed in a single layer by depositing only a silicon oxide SiOx.

Alternatively, the gate insulation film 202 can be formed in a double-layered structure by sequentially depositing a silicon nitride SiNx and a silicon oxide SiOx. In this case, the gate insulation film. 202 can be formed using organic silicon compounds, like a passivation layer 230 which will be described later. The organic silicon compound can be one of HMDS(N) (hexa-methyl-di-silazane, $C_6H_{19}NSi_2$), HMDS(O) (hexa-methyl-di-siloxane, $C_6H_{18}OSi_2$) and so on.

In other words, the gate insulation film 202 can be formed in a single layer or a multi-layered structure through the same procedure as the passivation layer 230 which is will be described in FIGS. 2C and 7.

If the gate insulation film 202 is formed in the single layer, it can be in a thickness range of 10 nm~1 μm. When the gate insulation film 202 is formed to have a plurality of insulation layers, each insulation layer can be formed in a thickness range of 10 nm~1 μm.

After the gate insulation film 202 is formed on the substrate 200 as described above, a channel layer 204 is formed on the gate insulation film. 202 opposite to the gate electrode 201. The channel layer 204 can be prepared by forming an oxide semiconductor layer on the entire surface of the above-mentioned substrate 200 (i.e., on the gate insulation film 202) and performing a second mask procedure for the oxide semiconductor layer.

The oxide semiconductor layer can be formed from an amorphous oxide which includes at least one of indium In, zinc Zn, gallium Ga and hafnium Hf. For example, if a gallium-indium-zinc-oxide (Ga—In—Zn—O) semiconductor layer is formed through a sputtering process, either sputtering targets of $In_2O_3$, $Ga_2O_3$ and ZnO can be used or a single sputtering target of a Ga—In—Zn oxide can be used. Also, when a hafnium-indium-zinc-oxide (Hf—In—Zn—O) semiconductor layer is formed, either sputtering targets formed from HfO2, In2O3 and ZnO can be used or a single sputtering target formed an Hf—In—Zn oxide can be used.

After the channel layer 204 is formed on the substrate 200 as described above, an etch stopper 210 is formed on the channel layer 204. The etch stopper 210 can be prepared by forming an insulation layer on the entire surface of the substrate 200 provided with the channel layer 204 and performing a third mask procedure for the insulation layer.

After the etch stopper 210 is formed on the substrate 200 as described above, a source electrode 207a and a drain electrode 207b are formed on both sides (or edges) of the channel layer 204, thereby completing a thin film transistor. The source electrode 207a and the drain electrode 207b can be prepared by forming a source/drain metal film on the entire surface of the substrate 200 provided with the etch stopper 210 and performing a fourth mask procedure for the source/drain metal film.

Although it is not shown in the drawings, the source electrode 207a is electrically connected to a data line. The data line is disposed in such a manner as to cross the gate line. The gate and data lines crossing each other define the pixel region.

The source/drain metal film can be formed from an opaque conductive material with a low resistance. The opaque conductive material with the low resistance can be one of aluminum Al, an aluminum alloy, tungsten W, copper Cu, nickel Ni, chromium Cr, molybdenum Mo, titanium Ti, platinum Pt, tantalum Ta and so on. Alternatively, the source/drain metal film can be formed in a multi-layered structure with at least one transparent conductive material layer and at least one opaque conductive material layer. The transparent conductive material can be one of indium-tin-oxide (ITO), indium-zinc-oxide (IZO) and so one.

Figure 2A:
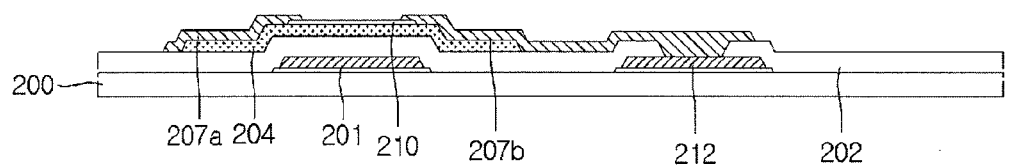
FIGS. 2A through 2D are cross-sectional views illustrating a method of manufacturing an OLED display device according to an embodiment of the present disclosure.
Figure 2B:
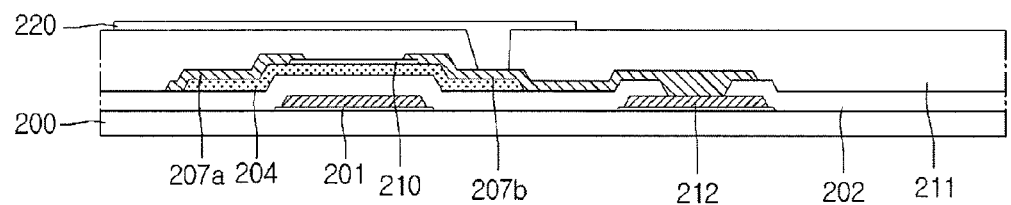
Figure 3A:
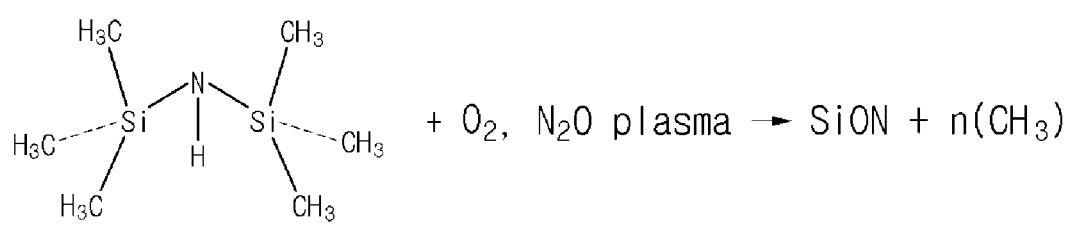
FIGS. 3A and 3B are diagrams showing structural formulas of organic silicon compounds which are used to form a passivation layer of the OLED display device according to an embodiment of the present invention.
Figure 3B:
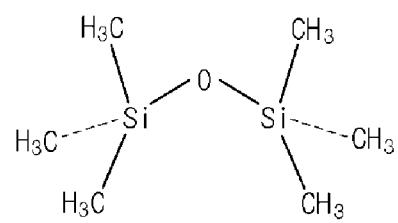

After the source and drain electrodes 207a and 207b are formed on the substrate 200 as described above, an interlayer insulation film 211 is formed on the entire surface of the substrate 200 provided with the source electrode 207a and the drain electrode 207b, as shown in FIG. 2B. Also, a contact hole exposing a part of the drain electrode 207b is formed in the interlayer insulation film 211 by performing a fifth mask procedure for the interlayer insulation film 211.

After the interlayer insulation film 211 is formed on the substrate 200 as described above, a first electrode 220 of an OLED is formed on the interlayer insulation film 211 in such a manner as to be electrically connected to the drain electrode 207b. The first electrode 220 can be prepared by forming a metal film on the entire surface of the above-mentioned substrate 200 (i.e., on the interlayer insulation film 211) and performing a sixth mask procedure for the metal film, after the contact hole is formed in the interlayer insulation film 211.

The first electrode 220 can be formed from a transparent conductive material such as indium-tin-oxide (ITO) or indium-zinc-oxide (IZO). As such, the first electrode 220 can be used as an anode electrode of the OLED. However, the first electrode 220 is not limited to this. Alternatively, the first electrode 220 can be formed from an opaque metal. In this case, the first electrode 220 can be used as a cathode electrode of the OLED.

Figure 2C:
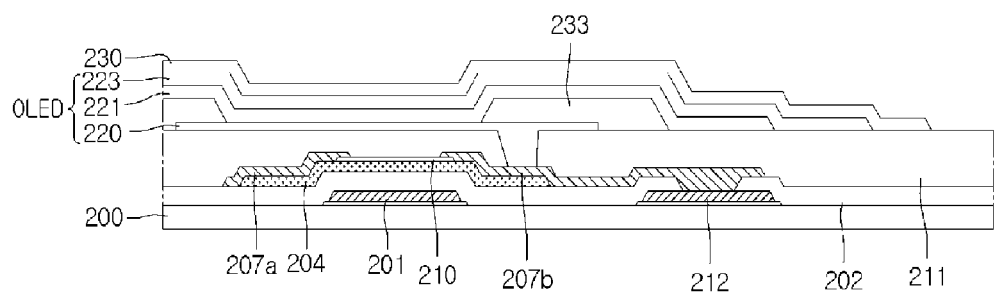

After the first electrode 220 is formed on the substrate 200 as described above, a bank layer 233 exposing the first electrode 220 by a size of the pixel region is formed as shown in FIG. 2C. The bank layer 233 can be prepared by forming an insulation film on the entire surface of the substrate provided with the first electrode 220 and performing a sixth mask procedure for the insulation film.

After the bank layer 233 is formed on the substrate 200 as described above, an organic emission layer 221 is formed on the first electrode 220 exposed by the bank layer 233.

The organic emission layer 221 can include a hole injection layer HIL, a hole transport layer HTL, an emission layer EML, an electron transport layer ETL and an electron injection layer EIL.

Also, a hole blocking layer can be included in the hole transport layer HTL. The electron transport layer ETL can be formed from a low molecular weight material such as PBD, TAZ, Alq3, BAlq, TPBI or Bepp2.

The emission layer EML of the organic emission layer 221 emits different color light according to organic formation material. As such, red, green and blue emission layers are formed in pixel regions, in order to realize full color. Alternatively, the emission layer EML can be a white emission layer which includes stacked red, green and blue organic materials. If the emission layer EML is a white emission layer, additional red, green and blue color filters can be formed on either a thin film transistor substrate or an upper substrate which is combined with the thin film transistor substrate. When the color filters are formed on the upper substrate, the OLED can be formed in a top emission structure.

After the organic emission layer 221 is formed on the first electrode 220 as described above, a second electrode 223 of the OLED is formed by depositing a metal film on the entire surface of the above-mentioned substrate 200. In other words, the second electrode 223 is formed on the entire surface of the substrate 200 provided with the organic emission layer 221.

The second electrode 223 can be used as a cathode electrode of the OLED. In this case, the second electrode 223 can be formed from a metal material with a lower work function than that of the first electrode 220. For example, the second electrode 223 can be formed from one of magnesium Mg, calcium Ca, aluminum Al, silver Ag, lithium Li and alloys thereof.

After the OLED is formed on the substrate 200 as described above, a passivation layer 230 is formed on the entire surface of the substrate 200 provided with the OLED. The passivation layer 230 is used to isolate the OLED from the exterior.

The passivation layer 230 disclosed in the present disclosure can completely encompass the OLED and protect the OLED from external moisture. Also, the passivation layer 230 can reduce a hydrogen content and prevent performance deterioration of the thin film transistor which is formed under the OLED.

In a detailed formation process of the passivation layer 230, an organic silicon compound such as HMDS(N) (hexa-methyl-di-silazane, C6H19NSi2), HMDS(O) (hexa-methyl-di-siloxane, C6H18OSi2) or others can be used as a formation material of the passivation layer 230.

As seen from a structural formula of FIG. 3A, HMDS(N) of the organic silicon compounds includes a combinatorial structure of Si—N. As such, HMDS (N) is easy to form a nitride. Also, HMDS (O) of the organic silicon compounds includes another combinatorial structure of Si—O as seen from another structural formula of FIG. 3B. As such, HMDS (O) is easy to form an oxide.

In order to form a SiNx film and/or a SiOx film which is used as the passivation layer, the related art performs a PECVD process using silane and ammonia gases. However, the present disclosure employing the organic silicon compound can form the SiNx layer and/or the SiOx without using any gas which includes hydrogen H like the above-mentioned gases.

If one organic silicon compound of HMDS(N) and HMDS(O) shown in the drawings is used, the passivation layer 230 of SiON can be formed by polymerizing the organic silicon compound with molecular oxygen O2 or molecular nitrogen N2 (or nitrogen monoxide NO) of a plasma state. Also, this formation process can be performed at temperatures below 100° C. As such, deterioration of the organic emission layer 221 can be prevented.

Such a passivation layer 230 of the present disclosure is formed using the organic silicon compound. As such, the passivation layer 230 is not exposed to any gas including hydrogen H during its formation process. Therefore, the hydrogen content of the passivation layer 230 can be lowered.

Also, the present disclosure can form the passivation layer of SiN or SiO species using the organic silicon compound. However, the present disclosure is not limited to this. Alternatively, the passivation layer 230 can be formed using a silicon oxycarbide SiOCx which enables the hydrogen content during the formation process of the passivation layer 230 to be lowered.

Moreover, the passivation layer 230 can be formed in a thickness range of about 30 nm~3 μm.

Figure 2D:
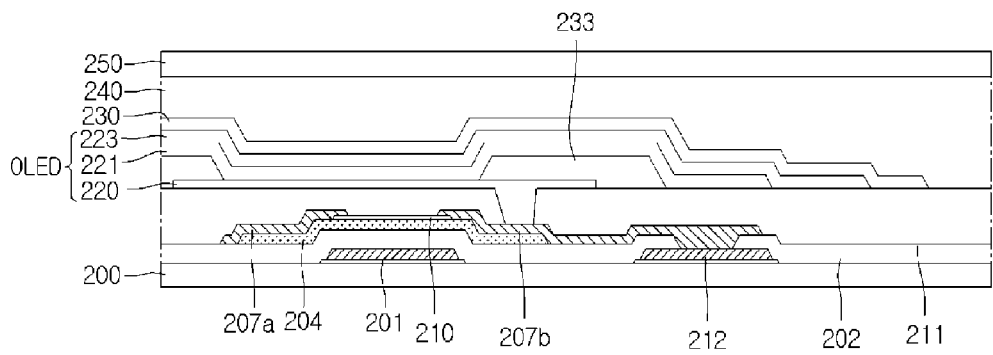

After the passivation layer 230 is formed on the substrate 200 as described above, an adhesive layer 240 and a sealing layer 250 are sequentially formed on the entire surface of the substrate 200 provided with the passivation layer 230 as shown in FIG. 2D. In accordance therewith, the OLED display device is completed.

In this manner, the present disclosure allows the passivation layer 230 with the low hydrogen content and a superior moisture intrusion prevention property to cover the OLED including the organic emission layer. As such, performance deterioration of elements can be prevented.

Also, the present disclosure enables the passivation layer sealing the OLED, which includes the organic emission layer, to be formed through the polymerization of the organic silicon compound and molecular oxygen or nitrogen O2 or N2 (or nitrogen monoxide NO). Therefore, the hydrogen content of the passivation layer can be minimized.

Figures 4, 5A, 5B:
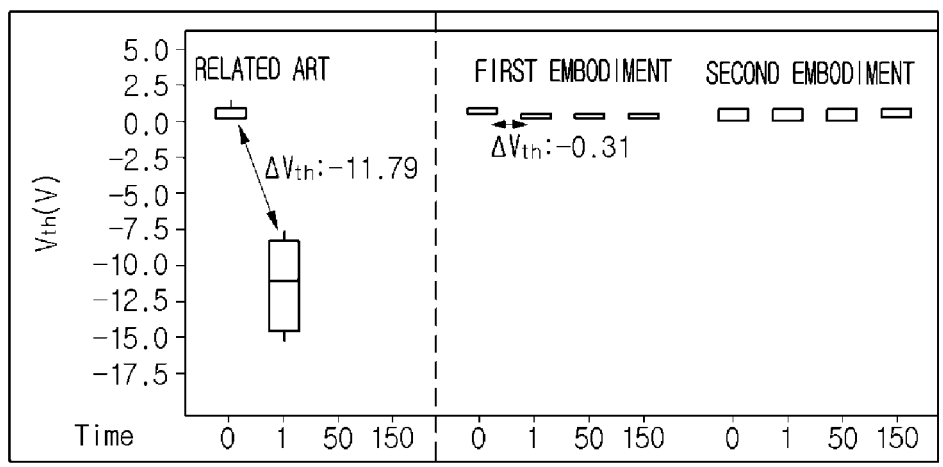
FIG. 4 is a graphic diagram comparing characteristics of thin film transistors using passivation layers of examples of the present invention and the related art.
FIG. 5A is a table illustrating components and hydrogen contents of passivation layers according to embodiments of the present invention.
FIG. 5B is a table illustrating a component and a hydrogen content of the passivation layer according to the related art.
Figure 6:
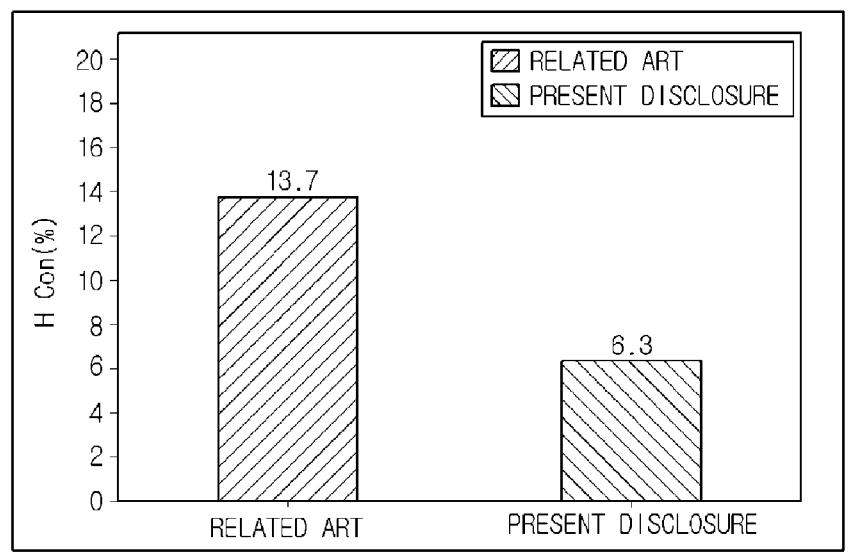
FIG. 6 is a graphic diagram comparing hydrogen contents of passivation layers according to the present invention (present disclosure) and the related art.

FIG. 4 is a graphic diagram comparing characteristics of thin film transistors using passivation layers of the present disclosure and the related art. FIG. 5A is a table illustrating components and hydrogen contents of passivation layers according to embodiments of the present disclosure. FIG. 5B is a table illustrating a component and a hydrogen content of the passivation layer according to the related art. FIG. 6 is a graphic diagram comparing hydrogen contents of passivation layers according to the present disclosure and the related art.

FIGS. 4 through 6 are experiment results for performance of thin film transistor within the OLED display device when the passivation layers are formed according to the present disclosure using the organic silicon compound and the related art.

The hydrogen H contained into the passivation layer deoxidizes an oxide channel layer of the thin film transistor and shifts a threshold voltage Vth of the thin film transistor. Due to this, it is necessary to perform the above-mentioned experiment.

As seen from FIG. 4, the threshold voltage Vth of the thin film transistor can be shifted toward a negative direction. If the passivation layer is formed according to the related art, it is evident that the threshold voltage Vth of the thin film transistor is severely shifted by a large deviation ΔVth of −11.79V in proportion to the formation process time.

On the other hand, when the passivation layer is formed using one of the organic silicon compounds such as HMDS (N) (hexa-methyl-di-silazane, C6H19NSi2) in accordance with a first embodiment of the present disclosure and HMDS(O) (hexa-methyl-di-siloxane, C6H18OSi2) in accordance with a second embodiment of the present disclosure, the threshold voltage Vth of the thin film transistor is finely shifted only by another deviation of −0.31V in proportion to the formation process time.

This results from the fact that a residual hydrogen content of the passivation layer is reduced by employing the organic silicon compound which includes the combinatorial structure of Si—N or Si—O is unnecessary to use any one of silane or ammonia gases as described in FIG. 2C.

As seen from FIGS. 5A, 5B and 6, it is evident that the passivation layer of SiONx, SiNx or SiOx formed using HMDS(N) (hexa-methyl-di-silazane, C6H19NSi2) in accordance with the first embodiment or HMDS(O) (hexa-methyl-di-siloxane, C6H18OSi2) in accordance with the second embodiment has the hydrogen content below 10%. Particularly, when the passivation layer of SiON is formed using HMDS(N) (hexa-methyl-di-silazane, C6H19NSi2) in accordance with the first embodiment, the hydrogen content of the passivation layer is lowered to 6.3%.

On the contrary, the related art passivation layer is above 10% in hydrogen content. More specifically, it is evident that the hydrogen content of the related art passivation layer of SiONx is increased to 13.7%.

Such a high hydrogen content of the passivation layer severely shifts the threshold voltage Vth of the thin film transistor which is formed under the OLED. Due to this, performance of the thin film transistor must deteriorate.

Figure 7:
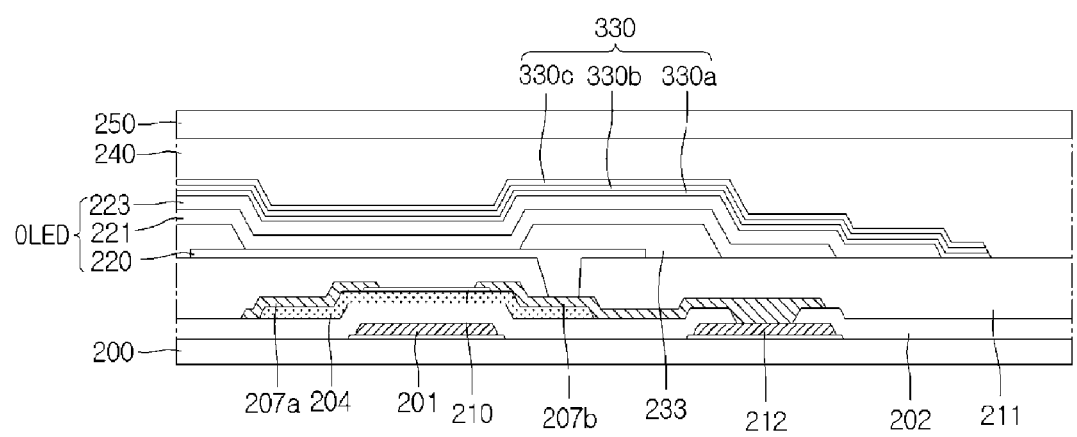
FIG. 7 is a cross-sectional view showing an OLED display device according to another embodiment of the present invention.

FIG. 7 is a cross-sectional view showing an OLED display device according to another embodiment of the present disclosure.

The manufacturing method of the OLED display device according to another embodiment as shown in FIG. 7 includes the same processes as that of the previous embodiment shown in FIGS. 2A through 2D, with the exception of some processes. Components of another embodiment having the same as those of the previous embodiment shown in FIGS. 2A through 2D will be referred to by the same reference numbers and names. Also, the description of another embodiment overlapping with the previous embodiment will be omitted.

In the manufacturing method of the OLED display device according to another embodiment of the present disclosure, a thin film transistor including a gate electrode 201, a gate insulation film 202, a channel layer 204, a source electrode 207a and a drain electrode 207b is formed on a substrate 200. Also, an OLED including a first electrode 220, an organic emission layer 221 and a second electrode 223 is formed over the thin film transistor.

Thereafter, a passivation layer 330 is formed on the substrate 200 provided with the OLED using organic silicon compounds, such as HMDS(N) (hexa-methyl-di-silazane, C6H19NSi2) and HMDS(O) (hexa-methyl-di-siloxane, C6H18OSi2), as described in FIG. 2C.

The passivation layer 330 can be formed in a multi-layered structure. For example, the passivation layer 330 can be formed in the multi-layered structure which includes stacked first through third passivation layers 330a, 330b and 330c.

The first through third passivation layers 330a, 330b and 330c can be formed by stacking SiONx, SiNx and SiOx layers using HMDS(N) (hexa-methyl-di-silazane, C6H19NSi2) and HMDS(O) (hexa-methyl-di-siloxane, C6H18OSi2).

For example, the first passivation layer 330a can be formed from SiONx, the second passivation layer 330b can be formed from SiNx, and the third passivation layer 330c can be formed from SiOx. However, the present disclosure is not limited to this. In other words, the first through third passivation layers 330a, 330b and 330c can be formed by repeatedly stacking one of SiONx, SiNx and SiOx layers.

The total thickness of the first through third passivation layers 330a, 330b and 330c can be in a range of 90 nm~26 μm. Also, each of the first and third passivation layer 330a and 330c can be formed in a thickness range of about 30 nm—3 µm, and the second passivation layer 330b can be formed in another thickness range of about 30 nm~20 µm.

As described above, the present disclosure allows the passivation layer 230 with the low hydrogen content and a superior moisture intrusion prevention property to cover the OLED including the organic emission layer. As such, performance deterioration of elements can be prevented.

Also, the present disclosure enables the passivation layer sealing the OLED, which includes the organic emission layer, to be formed through the polymerization of the organic silicon compound and molecular oxygen or nitrogen O2 or N2 (or nitrogen monoxide NO). Therefore, the hydrogen content of the passivation layer can be minimized.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing an organic light emitting diode display device, the method comprising:
    forming a gate electrode on a substrate;
    forming a gate insulation film on the substrate provided with the gate electrode;
    forming a channel layer, a source electrode and a drain electrode on the substrate provided with the gate insulation film;
    forming an organic light emitting diode which includes a first electrode connected to the drain electrode, an organic emission layer formed on the first electrode, and a second electrode formed on the organic emission layer;
    forming a passivation layer with a hydrogen content below 10%, on the substrate provided with the organic light emitting diode, by polymerizing an organic silicon compound with oxygen or nitrogen in a plasma state at a temperature below 100° C, wherein no silane or ammonia-based gases are used for forming the passivation layer such that the passivation layer is not exposed to hydrogen during its formation to minimize the hydrogen content of the passivation layer; and
    forming a sealing layer on the substrate provided with the passivation layer.

2. The method of claim 1, wherein the formation of the passivation layer includes enabling the organic silicon compound to be polymerized with plasma.

3. The method of claim 1, wherein the organic silicon compound is one of HMDS(N) (hexa-methyl-di-silazane, $C_6H_{19}NSi_2$) and HMDS(O) (hexa-methyl-di-siloxane, $C_6H_{18}OSi_2$).

4. The method of claim 3, wherein the hydrogen content of the passivation layer is below 6.3% when the organic silicon compound is HMDS(N) (hexa-methyl-di-silazane, $C_6H_{19}NSi_2$).

5. The method of claim 1, wherein the passivation layer is formed in a multi-layered structure using organic silicon compounds.

6. The method of claim 1, wherein the passivation layer is formed from one of SiNx, SiONx, SiOx and SiOCx.

7. The method of claim 1, wherein the gate insulation film is formed using an organic silicon compound.

8. The method of claim 7, wherein the organic silicon compound is one of HMDS(N) (hexa-methyl-di-silazane, $C_6H_{19}NSi_2$) and HMDS(O) (hexa-methyl-di-siloxane, $C_6H_{18}OSi_2$).

9. The method of claim 7, wherein the gate insulation film is formed to include in a multi-layered structure.

10. The method of claim 7, wherein a thickness of the gate insulation film is in a range of 10 nm~1 µm.

11. The method of claim 1, wherein a thickness of the passivation layer is in a range of 30 nm~3 µm.

* * * * *